United States Patent [19]

Choi

[11] Patent Number: 5,844,779
[45] Date of Patent: Dec. 1, 1998

[54] SEMICONDUCTOR PACKAGE, AND SEMICONDUCTOR DEVICE USING THE SAME

[75] Inventor: Sin Choi, Cheongju-si, Rep. of Korea

[73] Assignee: LG Semicon Co., Ltd., Chungcheongbuk-Do, Rep. of Korea

[21] Appl. No.: 639,649

[22] Filed: Apr. 29, 1996

[30] Foreign Application Priority Data

Apr. 27, 1995 [KR] Rep. of Korea ............... 1995-10042

[51] Int. Cl.[6] ........................................ H05K 7/20
[52] U.S. Cl. .................. 361/723; 257/675; 257/676; 257/684; 257/692; 361/813
[58] Field of Search ........................ 257/666, 672, 257/675, 676, 684, 692, 735, 784; 361/704, 707, 715, 717–718, 722–723, 813

[56] References Cited

U.S. PATENT DOCUMENTS

| | | | |
|---|---|---|---|
| 4,080,512 | 3/1978 | Ramet et al. | 257/775 |
| 4,677,526 | 6/1987 | Muehling | 361/386 |
| 4,873,615 | 10/1989 | Grabbe | 361/395 |
| 4,907,129 | 3/1990 | Shimizu | 361/813 |
| 5,299,091 | 3/1994 | Hoshi et al. | 361/723 |
| 5,559,366 | 9/1996 | Fosal et al. | 257/666 |
| 5,654,877 | 8/1997 | Burns | 361/723 |

FOREIGN PATENT DOCUMENTS

| | | | |
|---|---|---|---|
| 4031051 | 5/1991 | Germany | 257/666 |
| 0143639 | 7/1985 | Japan | 257/666 |
| 2303057 | 12/1990 | Japan | 257/666 |
| 3082068 | 4/1991 | Japan | 257/666 |
| 4120765 | 4/1992 | Japan | 257/775 |
| 6163789 | 6/1994 | Japan | 257/666 |

*Primary Examiner*—Gregory D. Thompson
*Attorney, Agent, or Firm*—Loudermilk & Associates

[57] ABSTRACT

A semiconductor package is provided. A semiconductor chip including bonding pads has a plurality of leads disposed on and attached to the upper surface of the semiconductor chip. The leads include bonding tips that are electrically connected to the bonding pads by bonding wires. A molding compound encapsulates the chip and portions of the leads. Upper portions of the leads extend from the molding compound. The exposed upper portions of the leads may be connected to a circuit board. Heat dissipation from the semiconductor chip is facilitated with the disclosed package.

20 Claims, 3 Drawing Sheets

SEMICONDUCTOR PACKAGE, AND SEMICONDUCTOR DEVICE USING THE SAME

FIELD OF THE INVENTION

This invention relates to improved packaging for semiconductor chips. In particular, a semiconductor package, and a leadframe for use in the semiconductor package is described, as well as a manufacturing method for forming the semiconductor package and lead frame. The resulting semiconductor package can be used with an electrical circuit board specially adapted for dissipating heat from the semiconductor package.

BACKGROUND OF THE INVENTION

In a conventional semiconductor package, in order to dissipate heat from the device with ease, a heat-exchanging portion is formed by overlaying a molded package with either a heat dissipation panel, or a panel with pins. A panel having heat dissipation pins can also be attached to a leadframe paddle.

A partial sectional view of the latter conventional package described above, is illustrated in FIG. 1. A heat dissipation plate 11 is attached to a back portion of semiconductor chip 10, and molding compound 12 is then used to enclose chip 10 and its signal leads.

In the structure of the conventional semiconductor package manufactured by such method, the heat generated in an upper part of the chip may not be transferred easily to heat dissipation plate 11 through the bottom of the chip. Therefore, in such a structure the heat cannot be dissipated efficiently.

The method in which a molded package is overlaid with either a heat dissipation panel or a panel with pins, is an ineffective heat sink because the heat dissipation plate is attached to the molding compound which typically has a high heat resistance.

SUMMARY OF THE INVENTION

It is an object of the present invention to improve the conventional heat sinking capability of a semiconductor package.

It is another object of the present invention to provide an improved leadframe and manufacturing method therefor.

A further object of the present invention is to provide an improved package for a semiconductor chip that includes the improved leadframe, and a method for making this package.

It is a further object of the present invention to provide an improved electrical circuit board which can be used with the aforementioned improved semiconductor package to enhance heat dissipation from the semiconductor chip.

The leadframe of the present invention has a side rail, a lead linking bar connected to the side rail, a plurality of leads connected to the lead linking bar through thinner cutting portions, and a plurality of bonding tips formed at the side of the leads respectively. The bonding tips are thinner than the leads and the latter are arranged in parallel and connected to the lead linking bars.

The method for manufacturing the leadframe comprises the steps of punching a metal plate on a portion which is later to become the bonding tips, and then forming a leadframe by etching or stamping the metal plate. As indicated above, the portions of the bonding tip are thinner than the leads in thickness. The improved electrical circuit board includes a circuit substrate made of a dielectric material, a circuit wiring formed on the substrate, and a plurality of heat dissipation pins disposed on the substrate in a pattern corresponding to leads of a semiconductor package. The heat dissipation pins are shaped like rectangular rods, are electrically connected to the circuit wiring and function as electric connections and heat dissipators.

When a semiconductor package is mounted on the electrical circuit board, the semiconductor leads transfer heat from the upper face of the semiconductor chip through the heat dissipation pins which are made of a metal having a high heat conductivity.

The semiconductor package includes a semiconductor chip having bonding pads in the center area of a surface thereof, and a plurality of leads disposed on and attached to a upper surface of the chip by an attaching means such as a conventional cured bonding tape. The attaching means does not cover the bonding pads of chip. The leads have a bonding tip disposed at the side thereof and are electrically connected to the bonding pads by bonding wires. The leads are arranged horizontally along the surface of the chip thereby providing large contact areas to the chip, and a molding compound hermetically encloses the chip and the attaching means but leaves the leads exposed.

The mold for forming the semiconductor package has two components. A lower mold has a cavity for holding the semiconductor device; a plurality of lead holes are formed on the bottom of the cavity where the outer leads of a semiconductor package are to be located. A mold cavity gate is formed, through which molding compound can flow to fill said mold cavity after an upper mold is coupled with said lower mold.

BRIEF DESCRIPTION OF THE DRAWINGS

The above object and other advantages of the present invention will become more apparent by describing in detail the preferred embodiment of the present invention with reference to the attached drawings in which.

DESCRIPTION OF THE PREFERRED EMBODIMENTS

Figure 1:
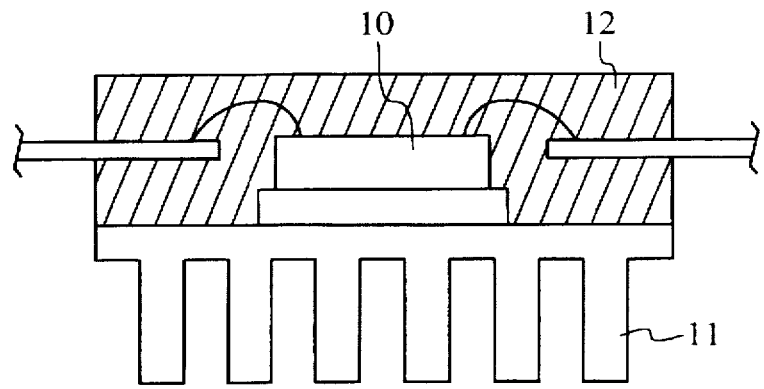
FIG. 1 is a sectional view of a conventional semiconductor package.
Figure 2:
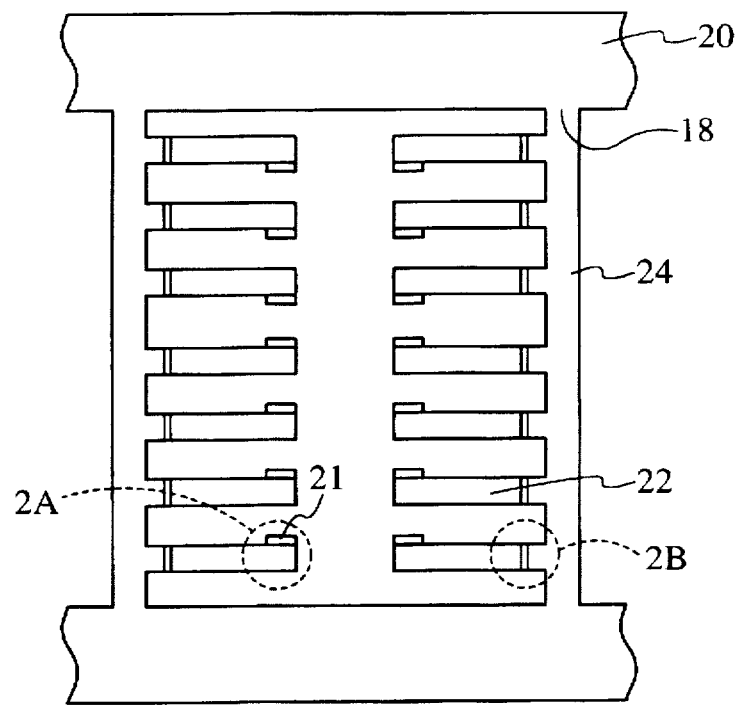
FIG. 2 is a top view of a leadframe of the present invention.

FIG. 2 is a top view of a leadframe of the present invention leadframe 18 of the present invention is formed by punching a metal plate such as a leadframe reel plate which for example can be a copper alloy of about 350 μm in thickness.

Figure 3:
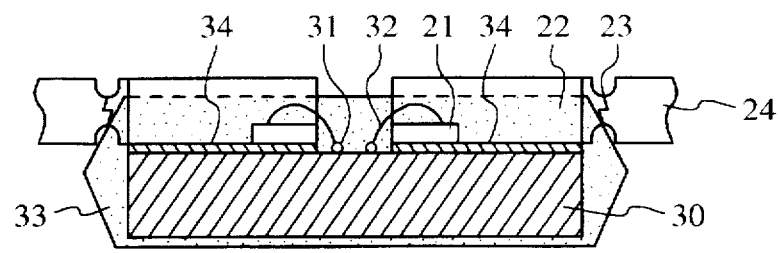
FIG. 3 is a sectional view of a semiconductor package of the present invention.

For manufacturing the leadframe, a plate is first punched in portions designed to be bonding tips 21 in order to make the portion to have a thickness thinner than other portions of leads 22 as illustrated in FIG. 2 and FIG. 3. Thinner cutting portions 23 are formed by simultaneous or independent punching of the plate.

A leadframe pattern is then formed by an etching process or again, by punching the metal plate. This punching process is a conventional technique for manufacturing leadframes.

The leadframe pattern formed from the metal plate has a side rail 20, a lead linking bar 24 connected to side rail 20, a plurality of leads 22 connected to lead linking bar 24 through thinner cutting portion 23, and a plurality of bonding tips 21 formed at one side and at one end of leads 22, as illustrated. Bonding tips 21 are formed to be thinner than the leads.

The semiconductor package according to the present invention as illustrated in FIG. 3 illustrates a small part of sectional view thereof, in which the leadframe described above is joined with chip 30 and enclosed in molding compound 33.

The semiconductor package of the present invention is made in such a way that a leadframe is attached to a chip by using an attaching means such as bonding tape 34 (for example: polyimide tape). The attaching means is cured to complete the bonding process between the chip die and the leadframe leads. Bonding pads 31 on chip 30 are then interconnected respectively with bonding tips 21 by using bonding wires 32. The chip used in these embodiments has the bonding pads in the center areas, but those skilled in the art will appreciate that other locations for the bonding pads can be easily accommodated by the present invention Thereafter, a package is formed in a mold, as illustrated in FIG. 4, which is designed to expose only a portion of the outside of leads 22 so that these leads are not enveloped by molding compound 33 (i.e., are not completely encapsulated with molding compound 33, but have an exposed upper portion as illustrated).

Figure 4:
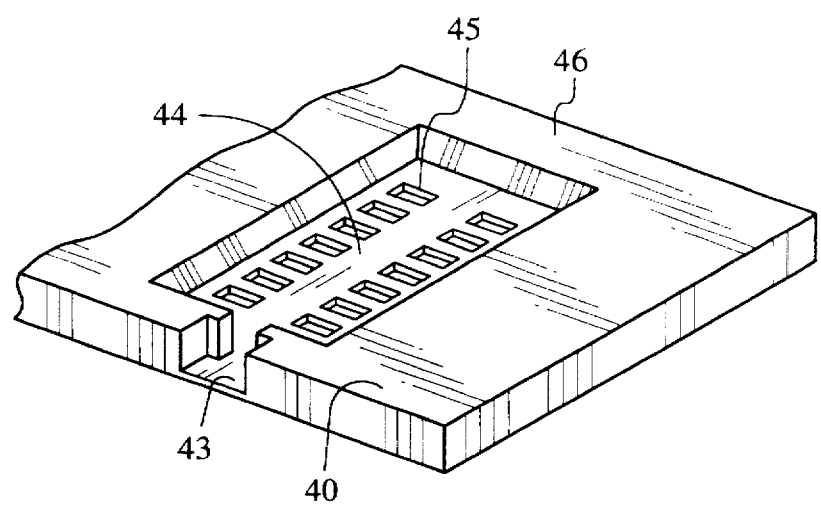
FIG. 4 is a perspective view of a mold used to make the semiconductor package of the present invention.

The mold is illustrated in FIG. 4. A lower part 40 of the mold has a mold cavity 44 which is designed to fit the size of the chip and has a plurality of lead holes 45 for receiving outer leads 22. On the bottom of mold cavity 44, a mold cavity gate 43 is formed through which a molding compound can be used to flow and fill mold cavity 44 after an upper mold (not shown) is joined with the lower mold. Lead holes 45 can be formed by a negative angle discharge process.

A molding process is performed such that a semiconductor package is created from the combined leadframe and semiconductor chip. These structures are arranged in lower mold 40, such that outer leads 22 are inserted in lead holes 45, and an upper mold is then joined and coupled to lower mold 40. A molding compound can then be injected through mold cavity gate 43. After the molding process, thinner cutting portions 23 (which are formed in the leadframe) are cut, thus leaving U-shaped grooves.

Accordingly, in the semiconductor package of the present invention, as illustrated in FIG. 3, only outer leads 22 are exposed and the remainder of the semiconductor chip and leadframe are encapsulated with molding compound 33.

Figure 5:
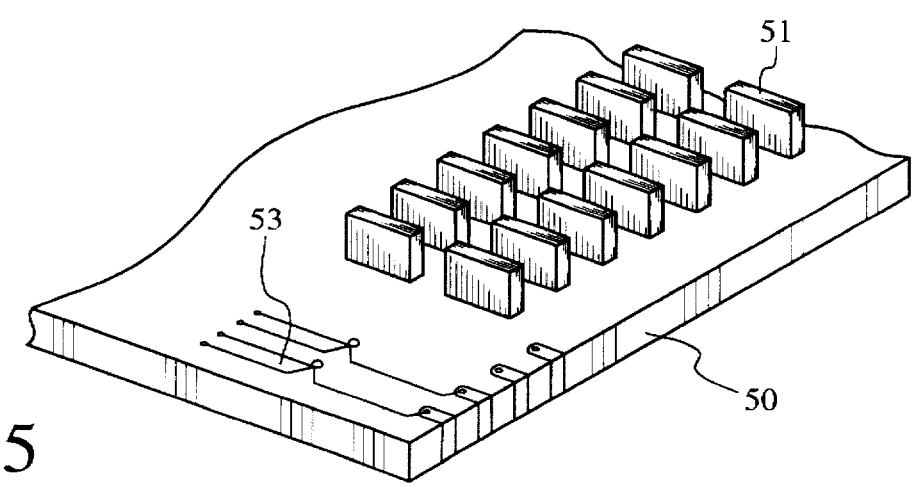
FIG. 5 is a perspective view of a substrate of an electrical circuit of the present invention.
Figure 6:
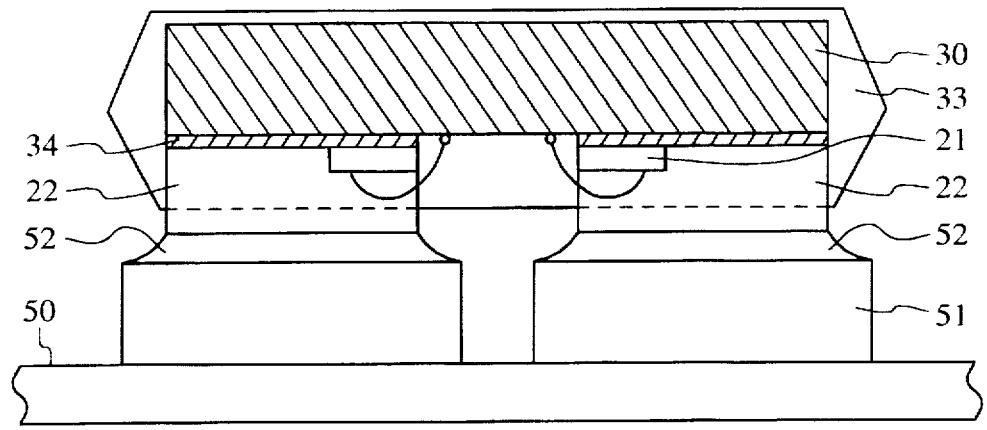
FIG. 6 is a sectional view illustrating a system that includes a semiconductor package of the present invention mounted on an electrical circuit board of the present invention.
Figure 7:
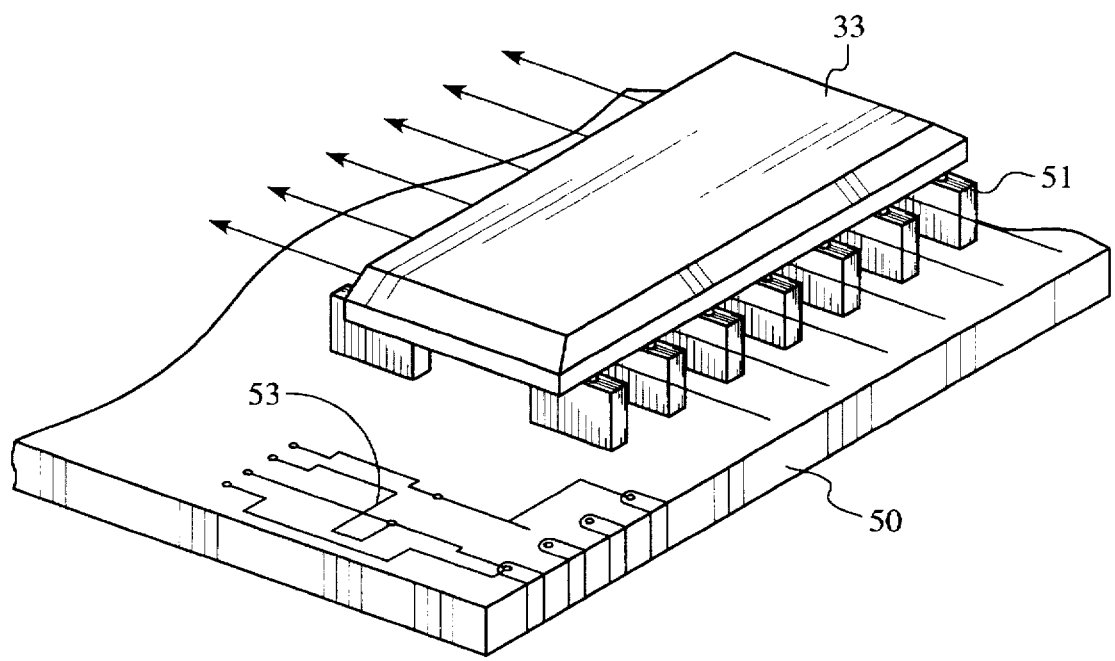
FIG. 7 is a perspective view illustrating a system that includes a semiconductor package of the present invention mounted on an electrical circuit board of the present invention.

FIGS. 5, 6 and 7 are schematic views for illustration of a semiconductor package mounted to an improved PCB board adapted for use with the present invention. FIG. 5 is a perspective view of a substrate portion of the printed circuit board. FIG. 6 is a partial sectional view illustrating the semiconductor package mounted to the printed circuit board, and FIG. 7 is a perspective view illustrating how the semiconductor package is surface mounted to the substrate 50 of the PCB.

The electrical circuit board of the present invention, as illustrated in FIG. 5, has a substrate 50 which is made of dielectric material, electric circuit wiring 53 formed on or in the substrate, and a plurality of heat dissipation pins 51 disposed on the substrate. Heat dissipation pins 51 are also used for electrically connecting outer leads 22 of the semiconductor package to electric circuit wiring 53.

Heat dissipation pins 51 can be formed in a manner that is used for any typical conductivity layer. For example, Ni—Pb layer can be formed by sputtering, CVD (Chemical Vapor Deposition) or plating on the substrate. A lithographic process is then carried out to form pins 51 in those places where the conductivity layer is partially etched, thus forming pins 51.

Another method of making heat dissipation pins would be to form a photoresist mask pattern on substrate 50 which is then patterned to have openings where the pins are to be connected to the leads of the semiconductor package. Then a metal or other conductive layer of predetermined thickness is formed by sputtering or plating. When the photoresist is removed, the pins are formed.

To surface mount the semiconductor package of the present invention to printed circuit board of the present invention as described above, solder paste is first plated in lead connecting portions of heat dissipation pins 51 on the PCB, and/or is applied to outer leads 22 of the package. The package is then positioned on a predetermined position on substrate 50, and then outer leads 22 are connected to heat dissipation pins 51 when the solder paste is heated to melt.

According to the above embodiments, effective heat sinking can be realized since the heat generated from a semiconductor chip inside the package is transferred through metal of the heat dissipation pins to the ambient air.

That is, since heat transfer is performed directly from the upper surface of the chip (which is the primary source of heat) to the heat dissipation pins, the heat transfer is efficiently accomplished and operating failures due to exceeding heat limitations are prevented.

Because a conventional trimming and forming process of the outer leads is unnecessary, the manufacturing process for the package is also simplified.

Although various preferred embodiments of the present invention have been disclosed for illustrative purposes, those skilled in the art will appreciate that various modifications, additions and/or substitutions are possible without departing from the scope and spirit of the present invention as disclosed in the claims.

What is claimed is:

1. A semiconductor package comprising:
    a semiconductor chip having a top surface and bonding pads on the top surface of the semiconductor chip;
    a plurality of leads secured to the top surface of the semiconductor chip, wherein each of the leads include an upper portion and a bonding tip;
    bonding wires for electrically connecting the bonding pads to the bonding tips; and
    molding compound encapsulating the semiconductor chip and the bonding tips, wherein the upper portions of the leads are exposed from a top surface of the molding compound.

2. The semiconductor package of claim 1, wherein the molding compound hermetically encapsulates the semiconductor chip.

3. The semiconductor package of claim 1, wherein the leads are in the form of rectangular rods.

4. The semiconductor package of claim 1, wherein the leads are located such that heat generated in the top surface of the semiconductor chip is transferred to the leads.

5. The semiconductor package of claim 1, wherein the bonding tips have a thickness less than the thickness of the leads at a portion that includes the upper portion.

6. The semiconductor package of claim 1, wherein the bonding tips are formed at an end edge of the leads.

7. The semiconductor package of claim 1, wherein the bonding tips are formed at a side edge of the leads.

8. The semiconductor package of claim 1, wherein the leads are secured to the semiconductor chip with bonding tape.

9. The semiconductor package of claim 1, further comprising heat dissipation pins attached to the exposed upper portion of the leads.

10. The semiconductor package of claim 1, wherein the upper portion of the leads protrude from the top surface of the molding compound.

11. A semiconductor device comprising:
    a semiconductor chip having a top surface, wherein the semiconductor chip includes a plurality of bonding pads on the top surface of the semiconductor chip;
    a plurality of leads secured to the semiconductor chip, wherein each of the leads includes a bonding portion and a length including an upper portion;
    bonding wires for electrically coupling the bonding pads to the bonding portions; and
    a molding compound encapsulating the chip and the bonding portions of the leads, wherein the upper portions of the leads extend from a top surface of the molding compound and are not encapsulated by the molding compound.

12. The semiconductor device of claim 11, wherein the bonding portions have a thickness less than the thickness of the leads at a portion that includes the upper portion.

13. The semiconductor device of claim 11, wherein the bonding portions are formed at an end edge of the leads.

14. The semiconductor device of claim 11, wherein the bonding portions are formed at a side edge of the leads.

15. The semiconductor device of claim 11, wherein the leads are secured to the semiconductor chip with bonding tape.

16. The semiconductor device of claim 11, further comprising heat dissipation pins attached to the upper portions of the leads.

17. The semiconductor device of claim 16, wherein the heat dissipation pins are conductive and are coupled to an electrical circuit board.

18. The semiconductor device of claim 11, wherein the bonding pads are located in a center portion of the semiconductor chip.

19. The semiconductor device of claim 11, a wherein the leads are bonded to the semiconductor chip.

20. The semiconductor device of claim 11, wherein the leads have an end portion extending from a side of the molding compound, wherein the end portion of each lead includes a thinner portion for cutting of the leads.

* * * * *

UNITED STATES PATENT AND TRADEMARK OFFICE
CERTIFICATE OF CORRECTION

PATENT NO. : 5,844,779
DATED : December 1, 1998
INVENTOR(S) : Sin Choi

Figure 2A:
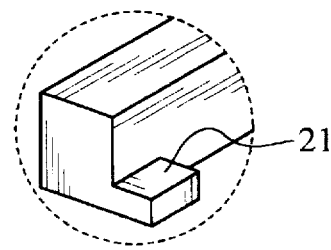
FIGS. 2A and 2B are perspective and enlarged views of bonding tips and thinner cutting portions of the present invention.
Figure 2B:
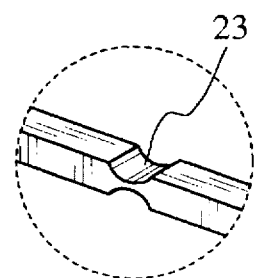

It is certified that error appears in the above-indentified patent and that said Letters Patent is hereby corrected as shown below:

Column 2, line 42, delete "FIGS. 2A and 2B are perspective and enlarged views of bonding tips and thinner cutting portions of the present invention;";

Column 2, line 46, after "invention;" but before line 47, insert --FIGS. 2A and 2B are perspective and enlarged views of bonding tips and thinner cutting portions of the present invention;--;

Column 2, line 67 after "invention" insert --Figs. 2A and 2B are perspective and enlarged views of bonding tips and thinner cutting portions of the present invention.--; (1st occurrence)

Column 2, line 67 after "invention" insert --.--; (1st occurrence)

Column 2, line 67 "leadframe" should be --Leadframe--;

Column 3, line 11, after "again", delete ",".

Signed and Sealed this

Nineteenth Day of October, 1999

Attest:

Attesting Officer

Q. TODD DICKINSON

Acting Commissioner of Patents and Trademarks